(12) United States Patent
Matsuura

(10) Patent No.: US 6,501,668 B2
(45) Date of Patent: Dec. 31, 2002

(54) SEMICONDUCTOR MEMORY DEVICE

(75) Inventor: Koji Matsuura, Kanagawa (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/907,920

(22) Filed: Jul. 19, 2001

(65) Prior Publication Data

US 2002/0024853 A1 Feb. 28, 2002

(30) Foreign Application Priority Data

Jul. 27, 2000 (JP) ........................................ 2000-227683

(51) Int. Cl.[7] ................................................. G11C 5/02
(52) U.S. Cl. ............................................ 365/51; 63/205
(58) Field of Search ............................ 365/51, 63, 205

(56) References Cited

U.S. PATENT DOCUMENTS

| | | | | |
|---|---|---|---|---|
| 6,097,640 A | * | 8/2000 | Fei et al. | 365/189.02 |
| 6,125,070 A | * | 9/2000 | Tomishima | 365/207 |
| 6,175,516 B1 | * | 1/2001 | Kitsukawa et al. | 365/63 |
| 6,282,147 B1 | * | 8/2001 | Fujima | 365/51 |

* cited by examiner

*Primary Examiner*—Huan Hoang
(74) *Attorney, Agent, or Firm*—McGinn & Gibb, PLLC

(57) ABSTRACT

A semiconductor memory device of present invention has a memory cell, a sense amplifier which amplifies data of the memory cell, first IO line connected to the sense amplifier, and second IO line which is connected to first IO line through a switch, wherein the second IO line is arranged on the memory cell.

2 Claims, 12 Drawing Sheets

SEMICONDUCTOR MEMORY DEVICE

BACKGROUND OF THE INVENTION

1. Field of the Invention

Present invention relates to a semiconductor memory device and, more particularly, to a configuration of sense amplifier and an IO line wiring pattern of the semiconductor memory device.

2. Description of Related Art

Figure 10:
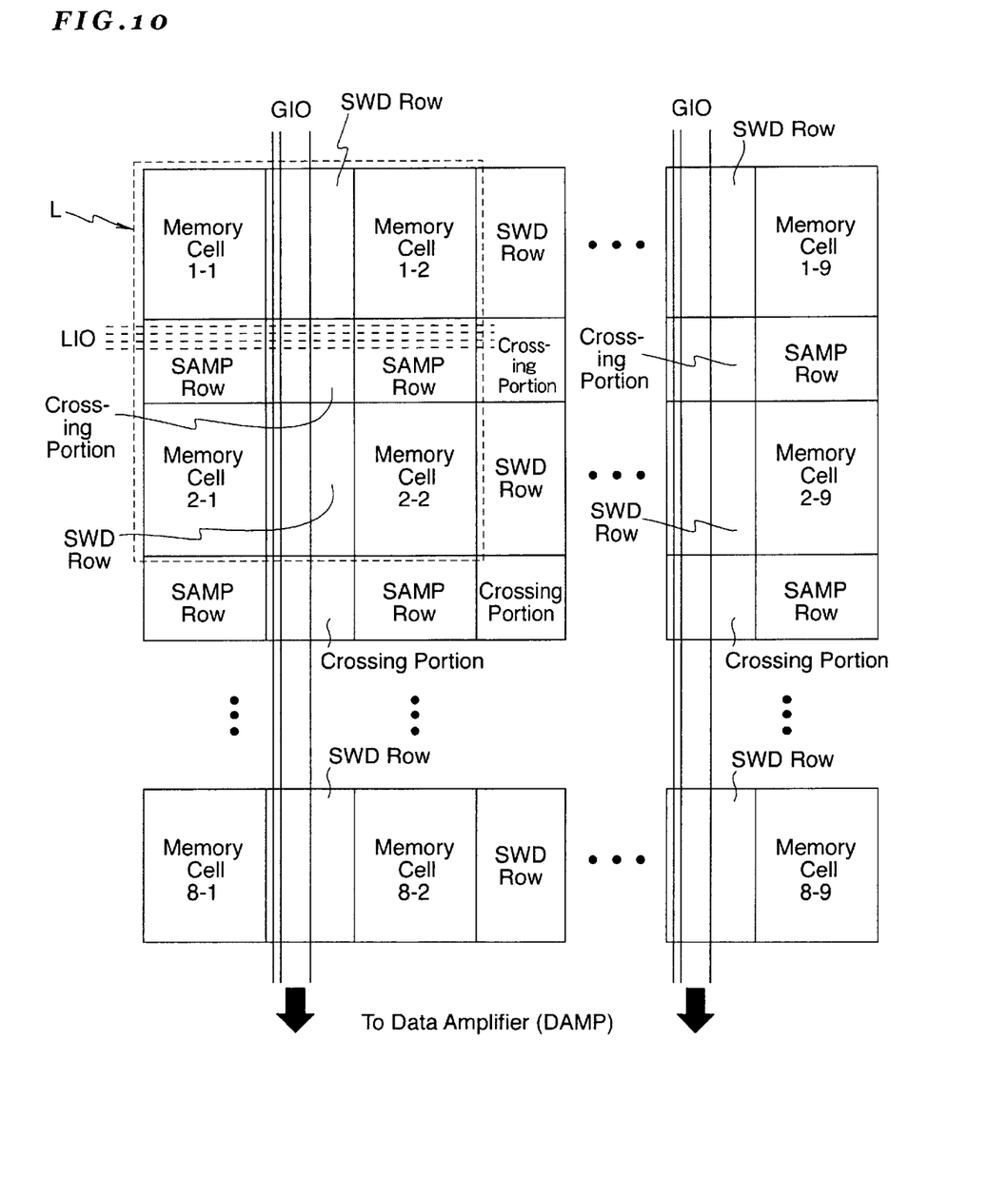
FIG. 10 is a view showing the conventional memory cell array portion.

FIG. 10 is an enlarged view of a part of an array portion among conventional semiconductor memory device.

In FIG. 10, LIO is first IO line connected to the sense amplifier which amplifies a data of a memory cell, and is arranged in a SAMP row region formed the sense amplifier. On the other hand, GIO is second IO line for connecting with LIO and supplying data to the data amplifier (DAMP). Here, GIO is formed on a sub WORD driver (SWD) formation region and on a crossing portion.

The memory cells are arranged with 8×8 sets. Between each memory cell, the SAMP row are arranged in a lateral direction in paper of FIG. 10, and the SWD row are arranged in a vertical direction in paper of FIG. 10. The crossing portions are arranged between each SAMP row and the SWD row respectively.

Figure 8:
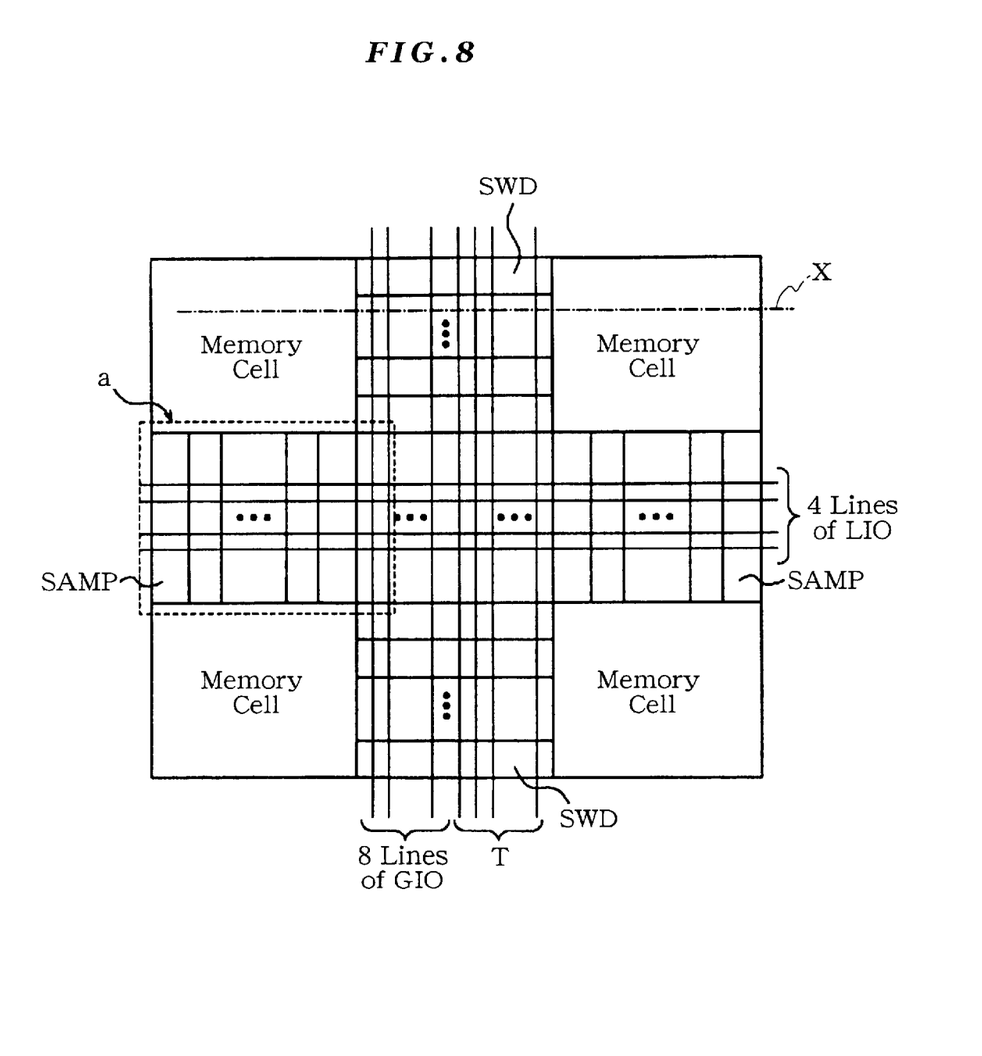
FIG. 8 is a view showing the conventional memory cell portion.
Figure 9:
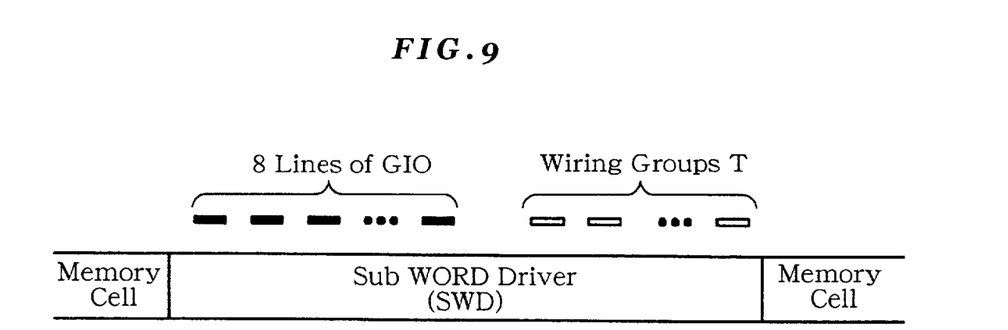
FIG. 9 is a sectional view taken on the X-line of a FIG. 8.

FIG. 8 is an enlarged view of a portion L of FIG. 10, and FIG. 9 is a simplified cross-sectional view which cut a drawing of FIG. 8 with a broken line X.

In FIG. 8, input/output wiring group T and eight lines of GIO are wired on the SWD, and it's cross-sectional view is shown in FIG. 9.

Figure 11:
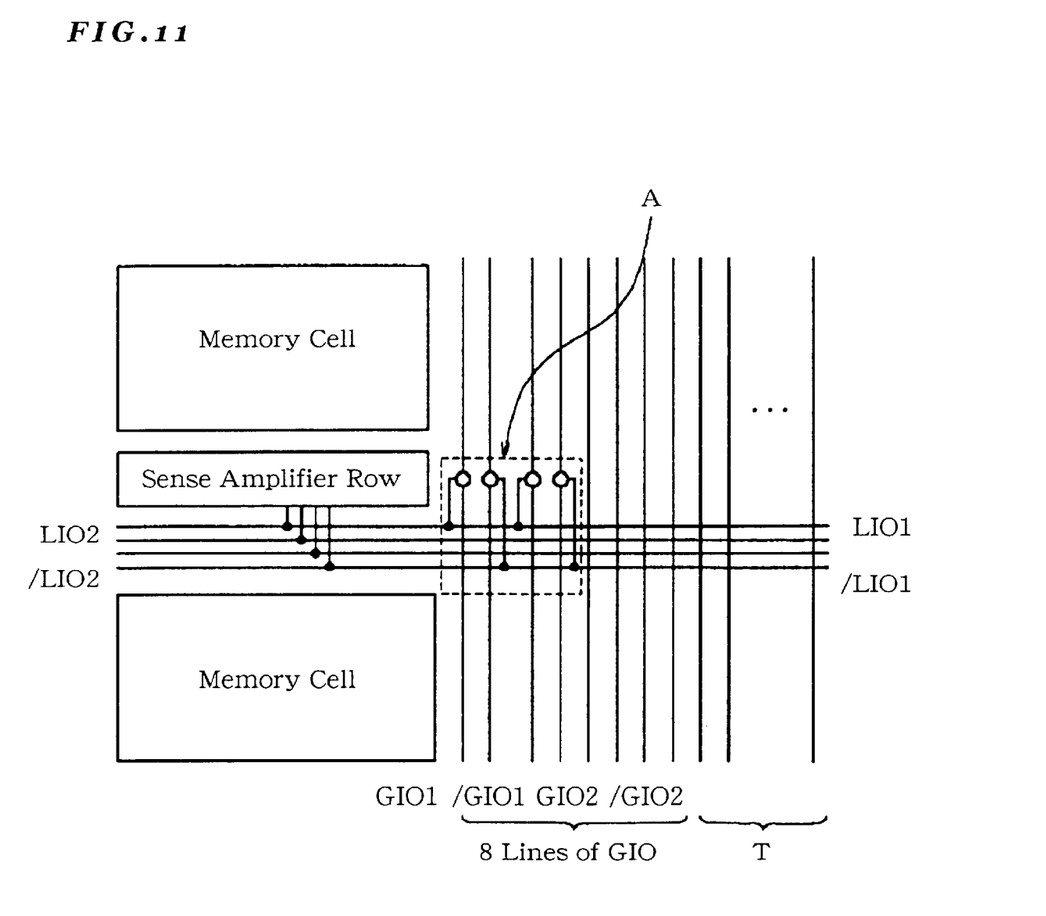
FIG. 11 is an enlarged view of the crossing portion circumference.
Figure 12:
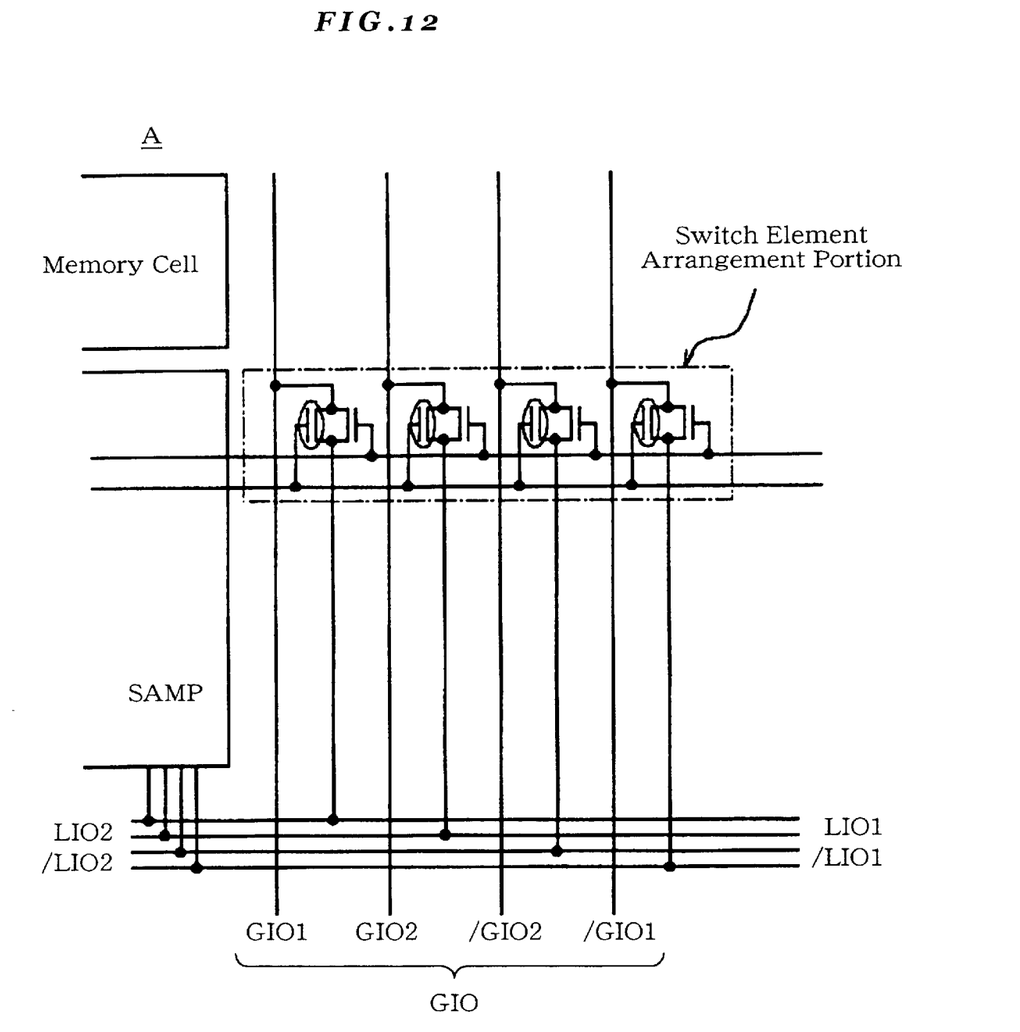
FIG. 12 is an enlarged view of the switch portion circumference.

FIG. 11 is an enlarged view of the crossing portion circumference where LIO and GIO intersect, and FIG. 12 is an enlarged view of a switch element arrangement portion circumference A which connects LIO and GIO. As shown in FIG. 11, LIO and GIO are connected through SW1. The SW1 serves as a transfer gate, as shown in FIG. 12.

In FIG. 11, there are eight lines of GIO to four lines of LIO. It is because, in the vertical direction of the paper of the FIG. 10, addresses differ in odd steps and even steps of a sense amplifier row.

SUMMARY OF THE INVENTION

In the conventional array portion, eight lines of GIO are wired on SWD and on the crossing portion. For this reason, the wiring groups T and GIO on the SWD occupy an area larger than the SWD. Therefore, it is not easy to downsize the SWD.

The semiconductor memory device of present invention has a memory cell, a sense amplifier for amplifying a data of the memory cell, first IO line connected to the sense amplifier, and second IO line which connected through a switch to first IO line, wherein the second IO line is arranged on the memory cell.

The above-mentioned switch is formed in the region in which the sense amplifier is formed.

Second IO line is connected to data amplifier.

Furthermore, the semiconductor memory device of present invention has the sense amplifier for amplifying the data of a memory cell. And the semiconductor memory device also has an IO line for supplying the data from the sense amplifier to data amplifier. As for the semiconductor memory device, the IO line is arranged on the memory cell.

The IO line consists of the first and second wiring portions, and it has the switch element which connects the first and second wiring portions.

The switch element is in the sense amplifier formation region.

DESCRIPTION OF THE PREFERRED EMBODIMENTS

Figure 1:
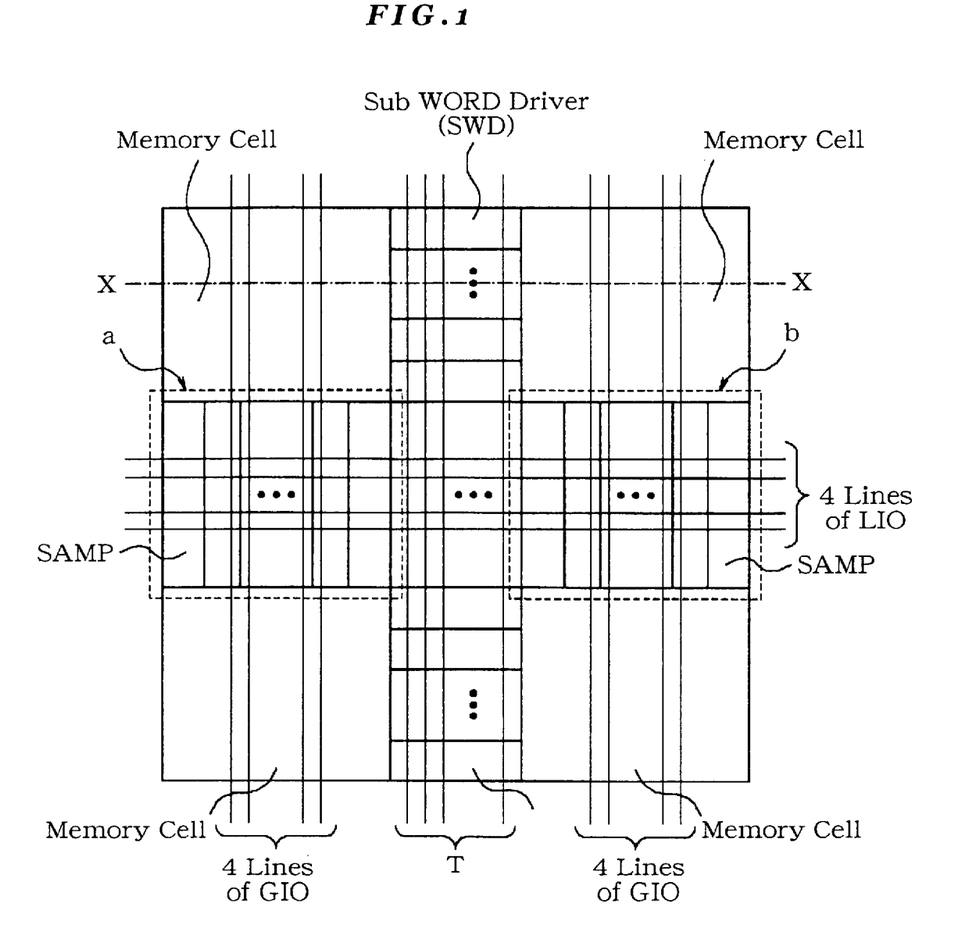
FIG. 1 is showing the memory cell array portion of present invention.

FIG. 1 is a view showing a part of an array portion of the semiconductor memory device of present invention.

As shown in FIG. 1, the semiconductor memory device has a first IO line local IO (hereinafter "LIO"), which connects with the sense amplifier (hereinafter, "SAMP") which amplifies a data of a memory cell, and second IO line global IO (hereinafter, "GIO") which connects with LIO and supplies the data to a data amplifier (DAMP).

Figure 2:
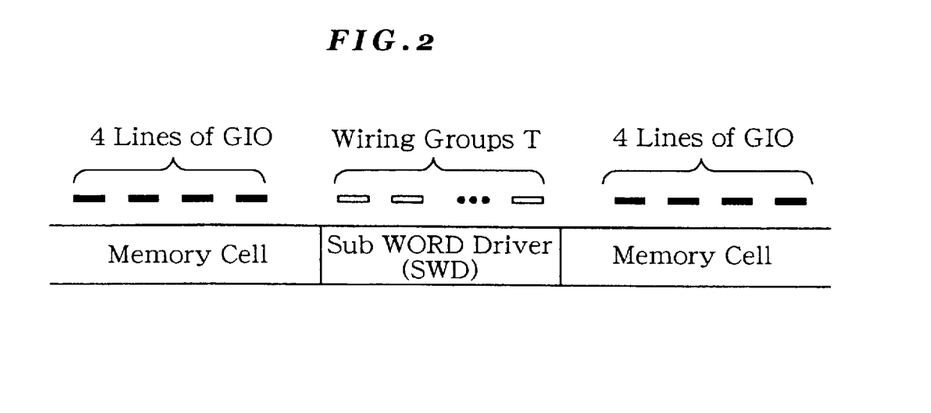
FIG. 2 is showing a cross-sectional view taken on the X-line of FIG. 1.

In the semiconductor memory device of such configuration, GIO conventionally wired on a sub WORD driver (hereinafter, "SWD"). But in present invention, GIO is wired on the memory cell. FIG. 2 is a simplified view of the cross-sectional view of FIG. 1 cut with a broken line X.

As shown in FIG. 2, GIO is formed on a memory cell region.

Figure 3:
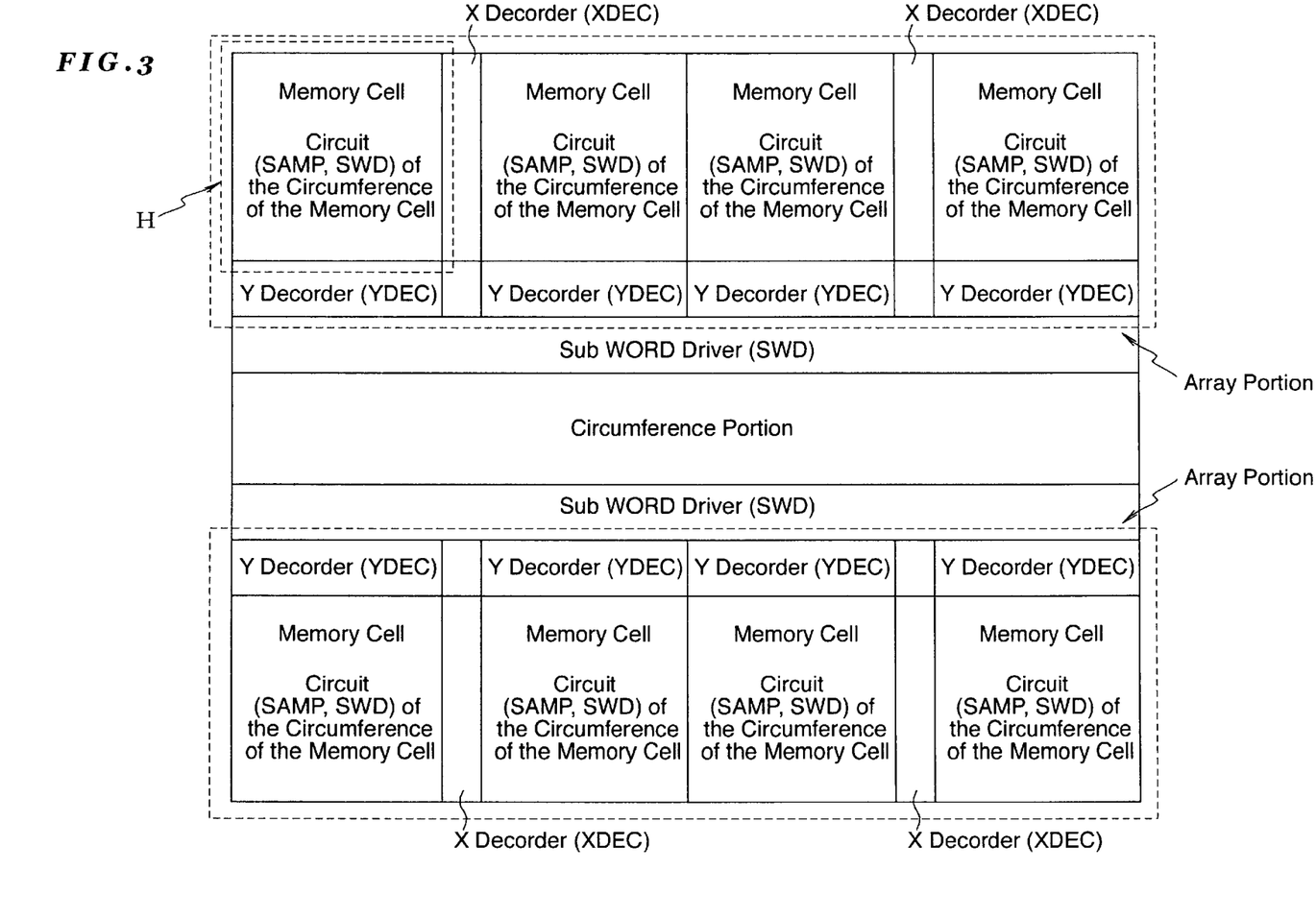
FIG. 3 is a simplified drawing showing the whole semiconductor memory device.

FIG. 3 is a simplified view of present invention showing whole configuration. A semiconductor chip is roughly divided into an array portion and a circumference portion. An array portion consists of the memory cell, a circuit (SAMP, SWD) of the circumference of the memory cell, an X decoder (XDEC) and a Y decoder (YDEC).

In present invention, the configuration of those other than a memory cell and the circuit (SAMP, SWD) of the circumference of the memory cell is the same as the conventional invention, and since it is well-known technology, so detailed explanation about portions other than a memory cell and the circuit (SAMP, SWD) of the circumference of the memory cell is omitted.

Figure 4:
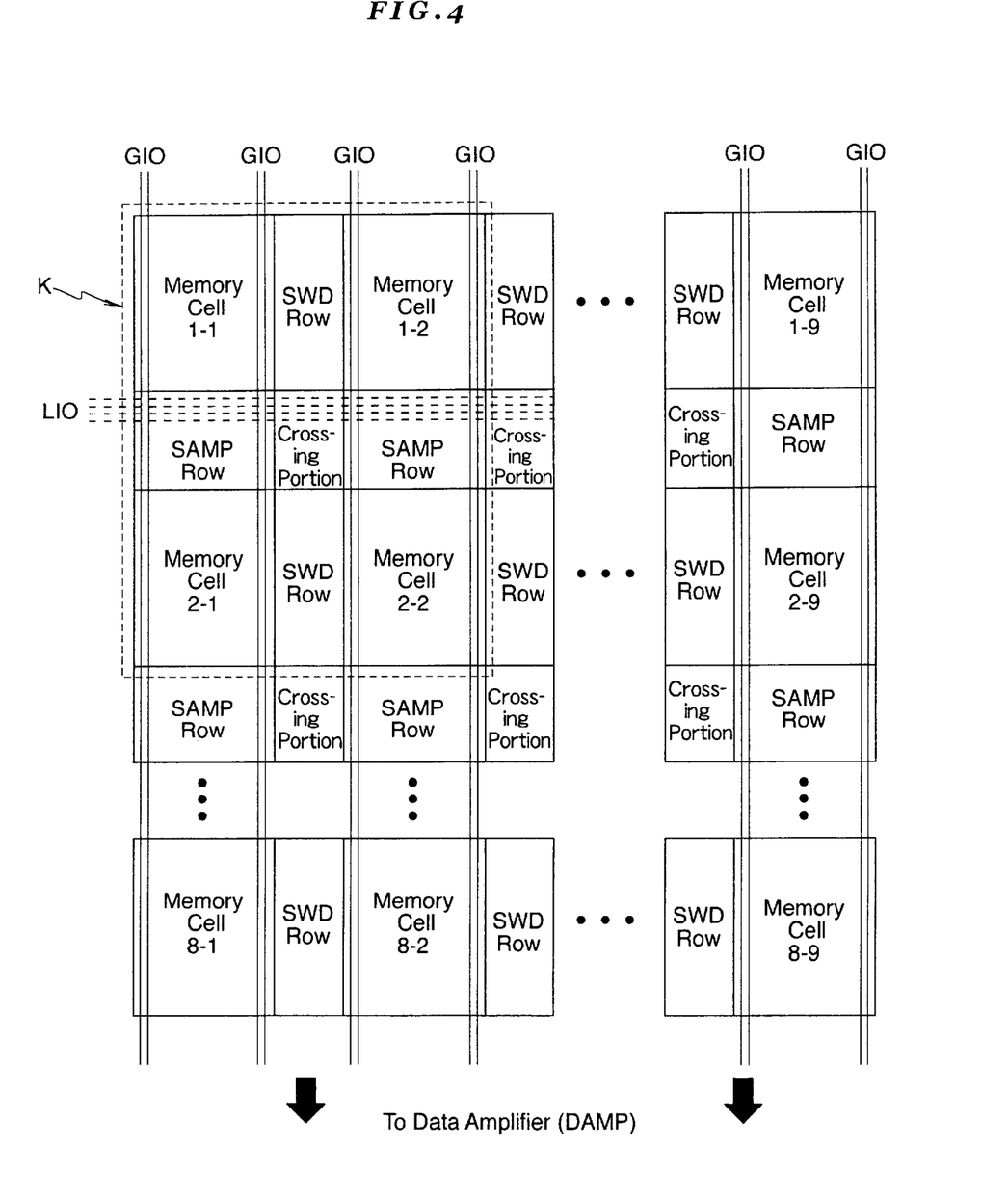
FIG. 4 is a view of the memory cell array portion of present invention.

FIG. 4 is an enlarged view of the portion H of the array portion of FIG. 3.

In FIG. 4, LIO is first IO line connected to the sense amplifier, GIO is second IO line connected to the LIO, wherein GIO is wired on the memory cell formation region and on the SAMP.

Moreover, the memory cells are arranged with 8×8 sets, SAMP rows are arranged in a lateral direction on a paper of the FIG. 4 between each memory cell, and SWD rows are arranged in a vertical direction, and crossing portions are arranged between SAMP rows and SWD rows respectively.

Figures 5A, 5B:
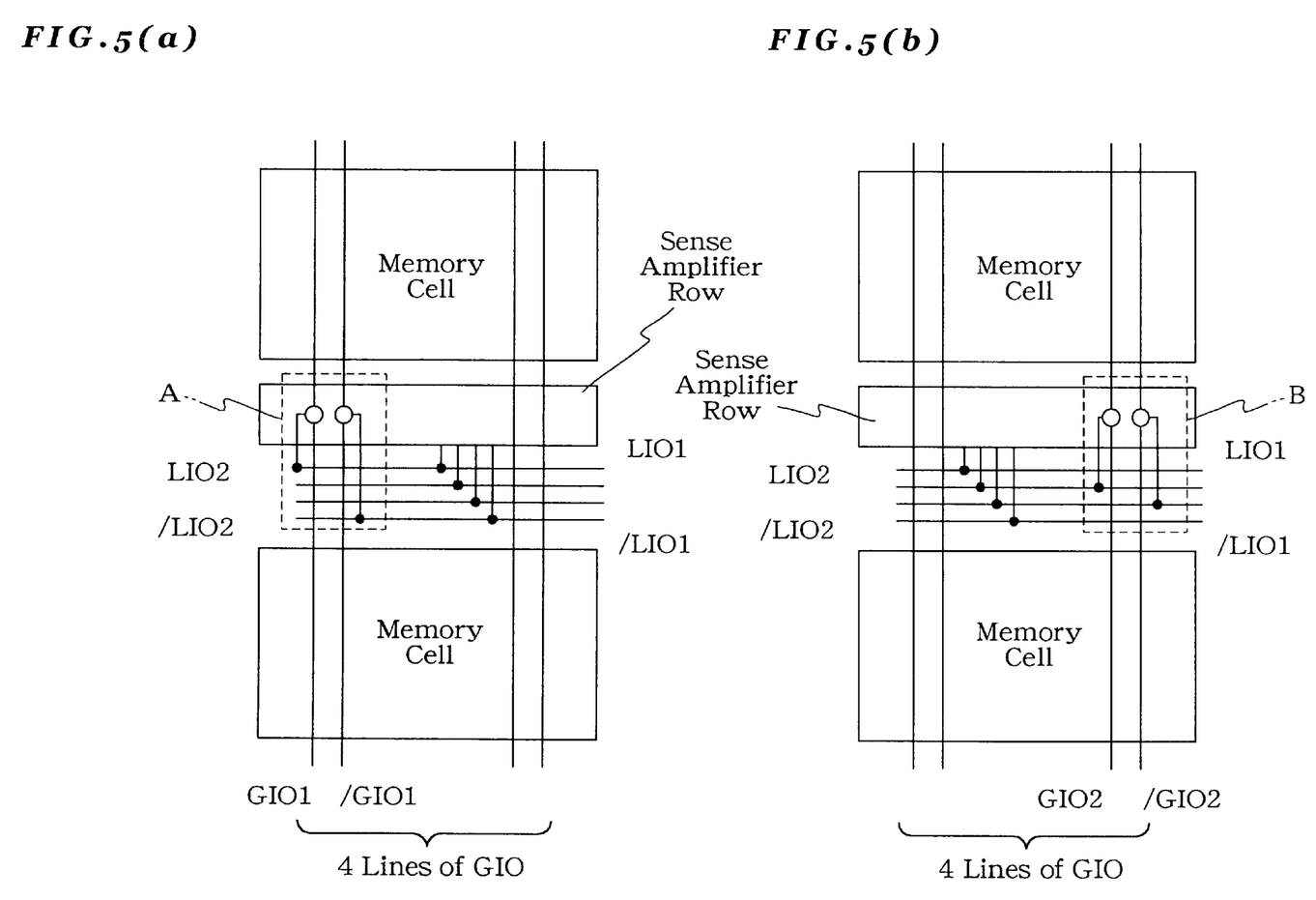
FIG. 5a is a partial enlarged view of FIG. 1.
FIG. 5b is a partial enlarged view of FIG. 1.

FIG. 5 is an enlarged drawing of FIG. 1(a) and FIG. 1(b).

In FIG. 5, since the global IO lines (GIO1, GIO1, GIO2, GIO2) are wired on a memory cell and the on SAMP, SW1 is formed in the sense amplifier row A and B, and global IO lines are connected through SW1 to local IO lines (LIO1, LIO1, LIO2, LIO2). Moreover, the global IO line is shared with other sense amplifier rows arranged up and down in FIG. 4. FIG. 2 is a simplified view of a cross-section taken on broken line X of FIG. 1. As shown in FIG. 2, GIO exists on a memory cell region.

Figure 6:
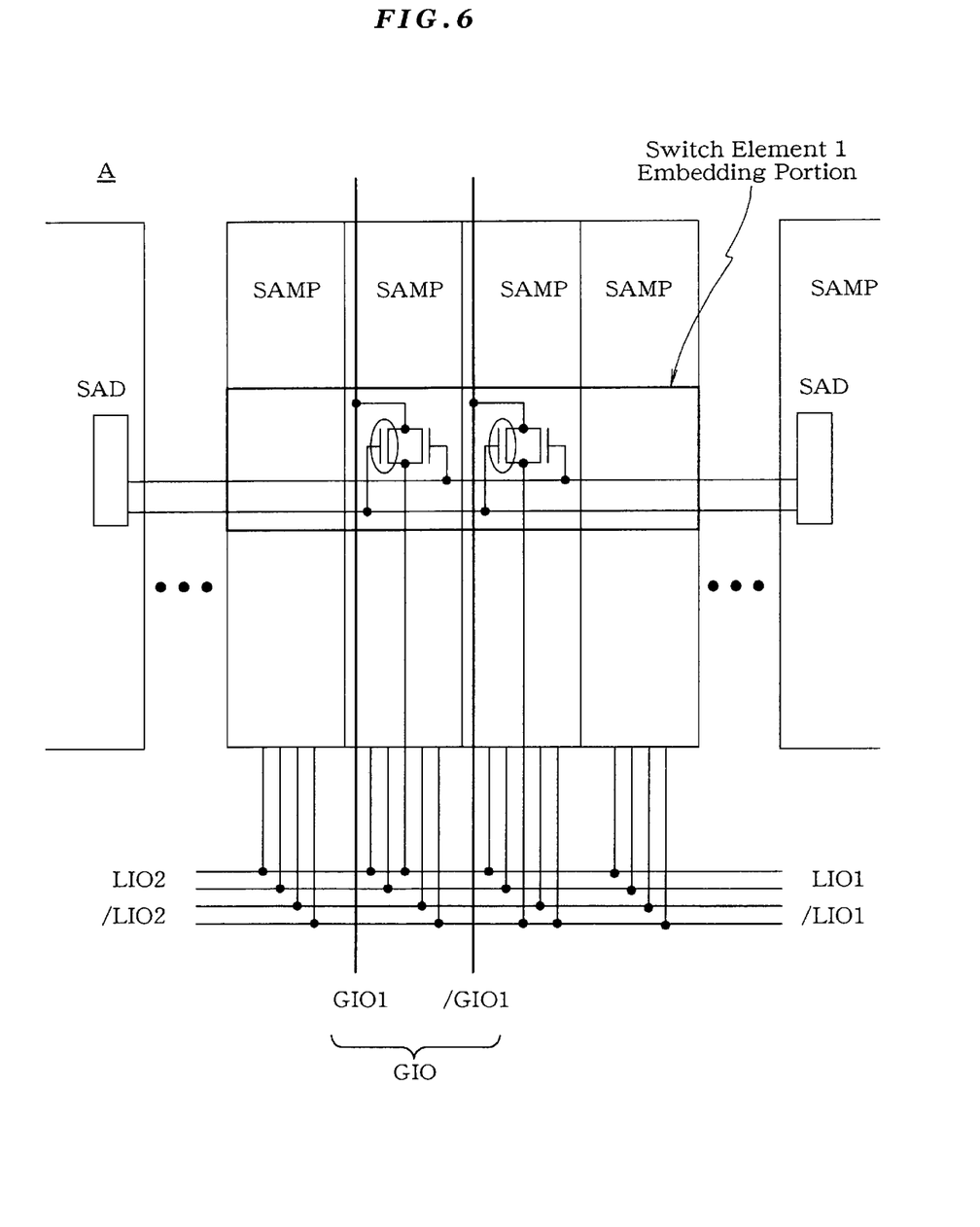
FIG. 6 is a partial enlarged view of FIG. 4.

FIG. 6 is an enlarged view of portions A and B of the SAMP row in which SW1 is formed in FIG. 4, and the GIO lines and the LIO lines are connected through the transfer gate.

Figure 7A:
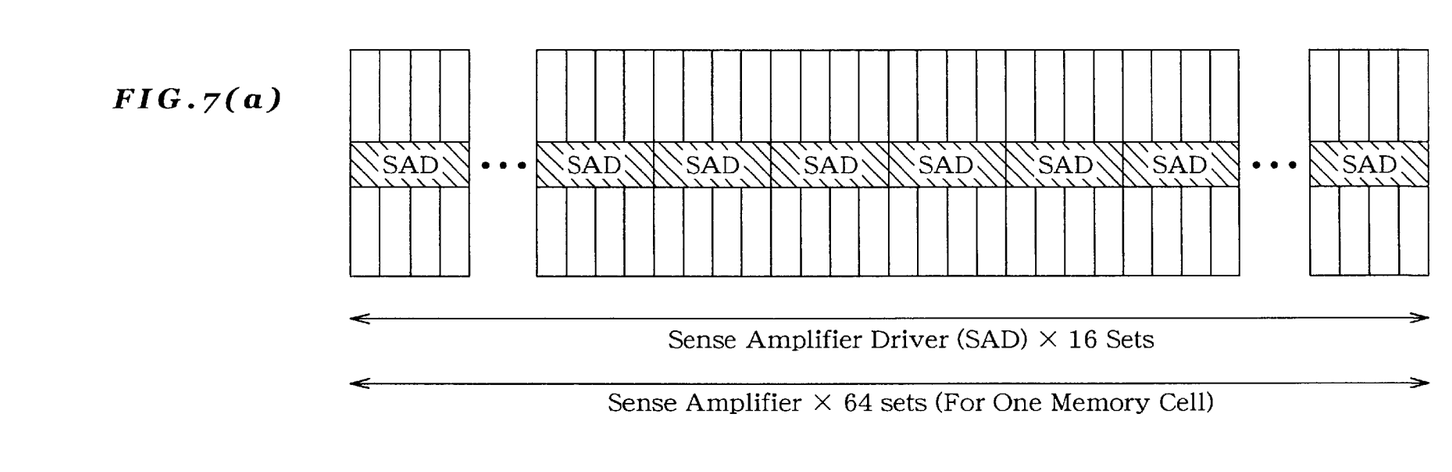
FIG. 7a is a block plan view of a sense amplifier row.
Figure 7B:
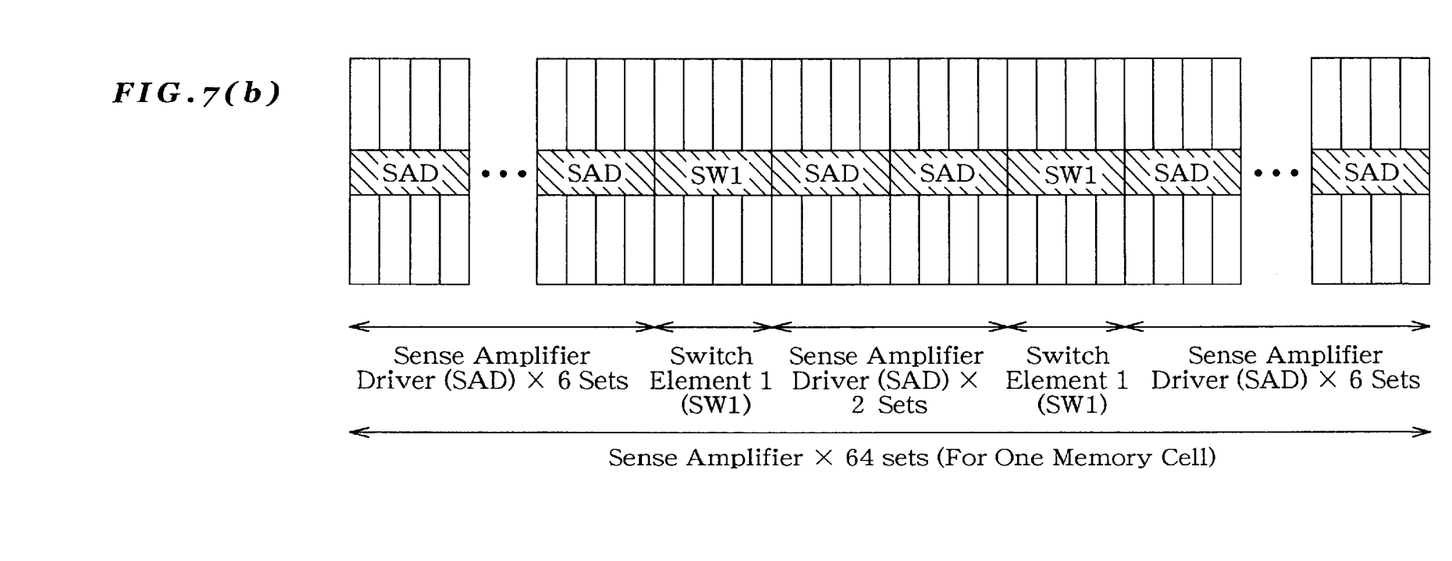
FIG. 7b is a block plan view of a sense amplifier row.

FIG. 7(b) is a simplified view of the SAMP row per one memory cell of present invention. As shown in FIG. 7(b), one sense amplifier is provided for every four SAMP(s), totally fourteen set of sense amplifier drivers (hereinafter "SAD") is formed in the SAMP row, and two sets of switch element 1 (hereinafter "SW1") for connecting the LIO and the GIO are formed in the sense amplifier row. FIG. 7(a) is a simplified view of the conventional SAMP row, and it differs from present invention in that SW1 is not formed in the sense amplifier row.

In FIG. 7(b), SAMPs are formed totally sixty four sets, fourteen sets of the SAD are formed for every four SAMP, and two sets of the SW1 is formed in SAMP row region, wherein SW1 is formed near the SAMP row center.

Figure 13:
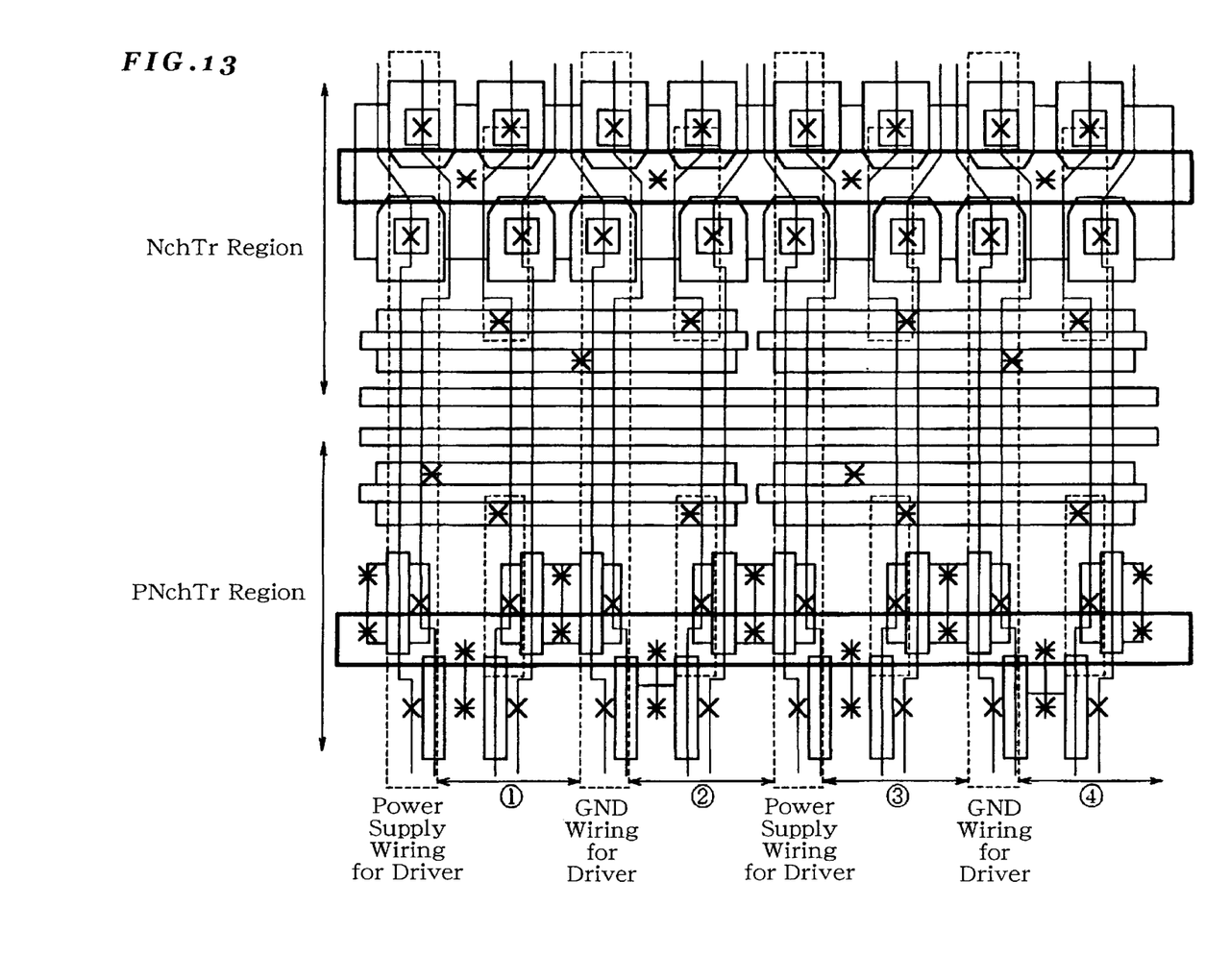
FIG. 13 is a conventional plane pattern view of the SAMP circumference.
Figure 14:
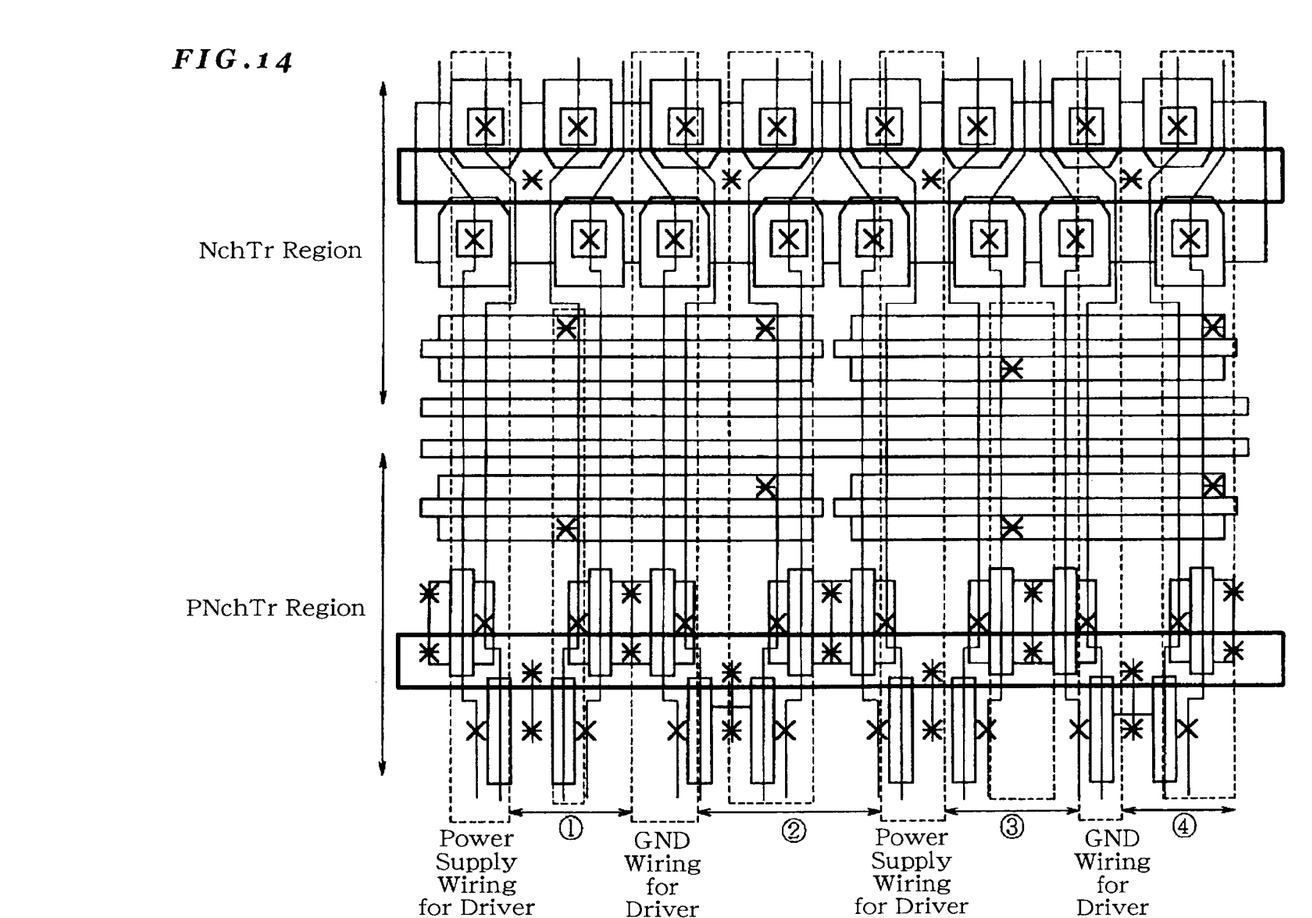
FIG. 14 is a plane pattern view of the SAMP circumference of present invention.

FIG. 14 is a SAMP portion mask drawing for forming the switch element 1 by present invention. FIG. 13 is the conventional SAMP portion having the SAD. FIG. 14 is the SAMP portion which formed SW1 by present invention.

In FIG. 13, the driver is embedded. And, in a space (1)–(4) between power source wiring and GND wiring connected to source of a Tr of the driver, a wiring is formed for connecting Tr output of the driver and Pch/Nch Tr source of sense amplifier.

In FIG. 14 shows an example of the driver consisting of the switch element 1. And the LIO and the GIO are wired in the space of (1)–(4) of FIG. 13 respectively. The LIO and the GIO are connected through the switch element 1.

Next, operation in the case of read-out is explained to an example among the write-in/read-out operations of data in a memory cell.

First, the data is read out from the memory cell, then voltage is applied to the sense amplifier while the sense amplifier driver is activated, and data is amplified with a sense amplifier. Here, since the input signal of the switch element 1 uses an input signal of Tr for sense amplifier drivers, the LIO and the GIO are conducted while the sense amplifier driver and the switch element 1 is activated.

Therefore, the data amplified with the sense amplifier is transferred in an order of LIO-switch element 1, GIO and the data amplifier.

In conventional invention, eight GIO(s) are wired on the sub word driver (SWD) and on the crossing portion in the array portion. But, in present invention, the eight GIOs are wired on a memory cell, and the size of the wiring which occupies SWD and the crossing portion becomes equivalent to the size of SWD. That is, the size of SWD and a crossing portion is reducible by the size of eight GIOs.

When width of GIO is defined as "a", and an interval of GIO is defined as "b", reducible size "d" is expressed as, $$d=8\times(a+b)$$

The invention may be embodied in other specific forms without departing from the spirit or essential characteristic thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

The entire disclosure of Japanese Patent Application No.2000-227683 (Filed on Jul. 27$^{th}$, 2000) including specification, claims, drawings and summary are incorporated herein by reference in its entirety.

What is claimed is:

1. A semiconductor memory device comprising:
   a memory cell,
   a sense amplifier for amplifying a data of said memory cell,
   a first IO line connected to said sense amplifier; and
   a second IO line connected through a switch to said first IO line, wherein said second IO line is arranged on said memory cell and wherein said switch is formed in the region having said sense amplifier and outside a sub WORD driver region, wherein the second IO line is connected to a data amplifier, wherein a width of said second IO line is defined as "a", and an interval between a plurality of second IO lines is defined as "b", then a reducible size "d" is expressed as d=8×(a+b).

2. A semiconductor memory device comprising:
   a sense amplifier for amplifying a data of said memory cell,
   an IO line for supplying said data from said sense amplifier to a data amplifier, wherein said IO line is arranged on said memory cell and comprises first and second wiring portions; and
   a switch element for connecting said first and said second wiring portion, wherein said switch element is formed in a region having said sense amplifier and outside a sub WORD driver region, wherein a second IO line is connected to the data amplifier, wherein a width of said second IO line is defined as "a", and an interval between a plurality of second IO lines is defined as "b", then a reducible size "d" is expressed as d=8×(a+b).

* * * * *